(12) United States Patent
Soussan et al.

(10) Patent No.: US 8,975,938 B2
(45) Date of Patent: Mar. 10, 2015

(54) INTEGRATED CIRCUIT COMPRISING AT LEAST ONE DIGITAL OUTPUT PORT HAVING AN ADJUSTABLE IMPEDANCE, AND CORRESPONDING ADJUSTMENT METHOD

(71) Applicants: STMicroelectronics SA, Montrouge (FR); Commissariat a l'Energie Atomique et aux Energies Alternatives, Grenoble (FR)

(72) Inventors: Dimitri Soussan, Grenoble (FR); Sylvain Majcherczak, St. Pierre d'Allevard (FR); Alexandre Valentian, Saint Egreve (FR); Marc Belleville, Saint Egreve (FR)

(73) Assignees: STMicroelectronics SA, Montrouge (FR); Commissariat a l'Energie Atomique et aux Energies Alternatives, Grenoble (FR)

( * ) Notice: Subject to any disclaimer, the term of this patent is extended or adjusted under 35 U.S.C. 154(b) by 0 days.

(21) Appl. No.: 13/904,606

(22) Filed: May 29, 2013

(65) Prior Publication Data
US 2013/0321057 A1 Dec. 5, 2013

(30) Foreign Application Priority Data

May 30, 2012 (FR) ..................................... 12 54950

(51) Int. Cl.
*H03L 5/00* (2006.01)
*H03K 19/0185* (2006.01)
*H01L 27/12* (2006.01)

(52) U.S. Cl.
CPC .... *H03K 19/018578* (2013.01); *H01L 27/1203* (2013.01)
USPC ........................................... 327/308; 327/306

(58) Field of Classification Search
USPC ......... 327/306, 108, 319, 333, 308; 333/81 R
See application file for complete search history.

(56) References Cited

U.S. PATENT DOCUMENTS 5,231,311 A * 7/1993 Ferry et al. ....................... 326/27
5,754,480 A 5/1998 Sato
(Continued)

OTHER PUBLICATIONS

Kyoung-Hoi Koo, et al., "A versatile I/O with robust impedance calibration for various memory interfaces," in 2006 IEEE International Symposium on Circuits and Systems, 2006. ISCAS 2006. Proceedings, 2006, pp. 1-4.
(Continued)

*Primary Examiner* — Dinh Le
(74) *Attorney, Agent, or Firm* — Allen, Dyer, Doppelt, Milbrath & Gilchrist, P.A.

(57) ABSTRACT

An integrated circuit may include a digital output port including a buffer stage that includes subassemblies of MOSFET transistors. One subassembly may include two pull-up transistors having sources connected to a common high voltage, and having drains connected to a common node connected to the output terminal. Another subassembly may include pull-down transistors having sources connected to a common low voltage, and having drains connected to the common node. The pull-up and pull-down transistors are formed in a thin semiconductor layer of an FDSOI substrate. The substrate may include a thick semiconductor layer and an oxide layer separating the thin and thick semiconductor layers. Areas of the thick semiconductor layer facing the pull-up and pull-down transistors may be connected to a circuit configured to vary a threshold voltage of the pull-up and pull-down transistors.

18 Claims, 5 Drawing Sheets

(56) References Cited

U.S. PATENT DOCUMENTS

| | | | |
|---|---|---|---|
| 6,141,258 A * | 10/2000 | Kawasumi | 365/189.05 |
| 6,356,105 B1 * | 3/2002 | Volk | 326/30 |
| 6,780,693 B2 * | 8/2004 | Seo et al. | 438/166 |
| 7,102,200 B2 | 9/2006 | Fan et al. | |
| 7,696,778 B1 | 4/2010 | Sreeramaneni et al. | |
| 2002/0101278 A1 | 8/2002 | Schultz et al. | |
| 2005/0127958 A1 | 6/2005 | Ho et al. | |
| 2007/0063284 A1 | 3/2007 | Kawahara et al. | |

OTHER PUBLICATIONS

S. Sidiropoulos, et al., "Circuit design for a 2.2 GB/s memory interface," in Solid-State Circuits Conference, 2001. Digest of Technical Papers. ISSCC. 2001 IEEE International, 2001, pp. 70-71, 433.

D. Soussan et al., "A Mixed LPDDR2 Impedance Calibration Technique exploiting 28nm Fully-Depleted SOI Back-Biasing," in IC Design & Technology (ICICDT), 2012 IEEE International Conference on May 30, 2012-Jun. 1, 2012, pp. 1-4.

* cited by examiner

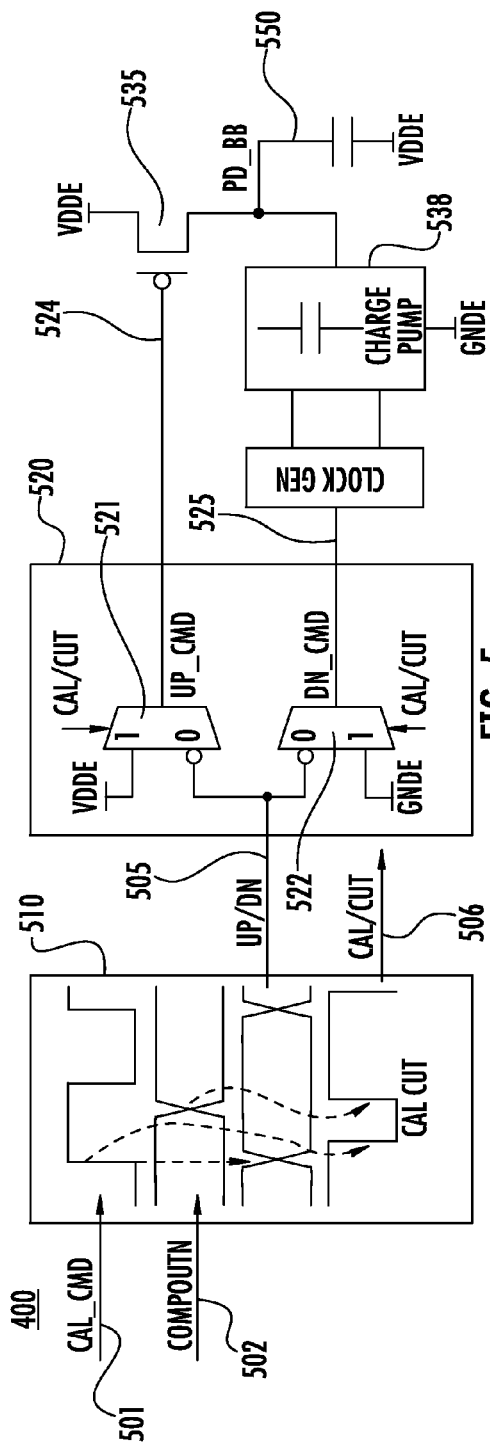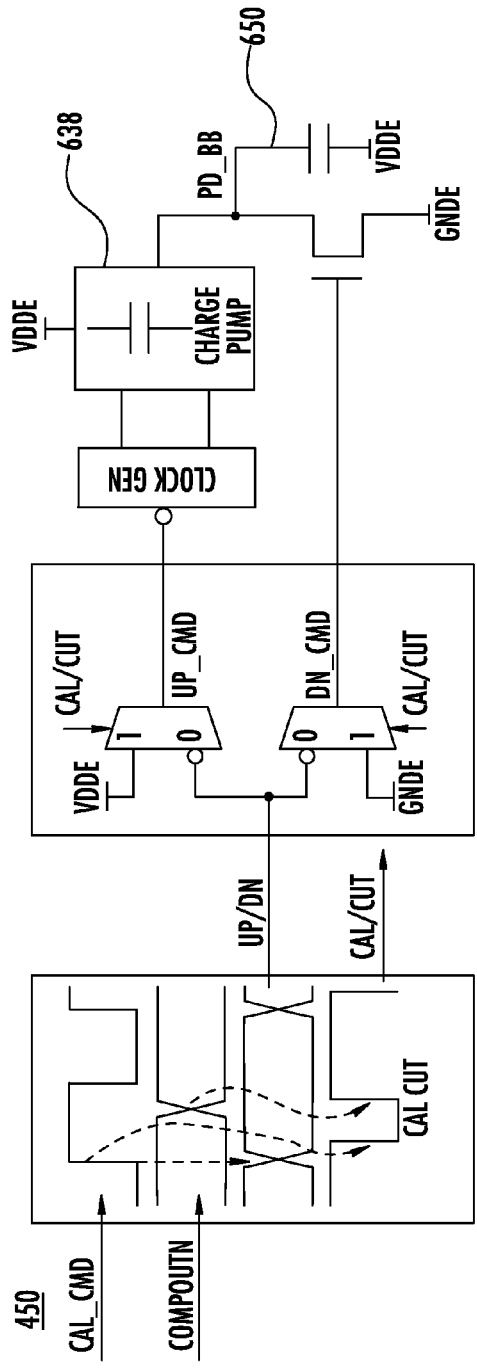

INTEGRATED CIRCUIT COMPRISING AT LEAST ONE DIGITAL OUTPUT PORT HAVING AN ADJUSTABLE IMPEDANCE, AND CORRESPONDING ADJUSTMENT METHOD

FIELD OF THE INVENTION

The present disclosure relates to the field of microelectronics, and more specifically to the design of digital integrated circuits. It more specifically aims at specific arrangements relative to the adjustment of the output impedance of digital ports.

BACKGROUND OF THE INVENTION

Generally, digital components have input and output ports which enable the exchange of signals with neighboring components. As an example, communication between a microprocessor and a random access memory (RAM) may be mentioned.

In the search for high performance, increasing the operating frequency of the processor may be desirable, and thus the frequency of exchanges with neighboring components. At a certain level, the characteristic impedance of the connection between the output of a component and the input of the neighboring component may have an influence on the quality of the transmitted signal. In other words, it may be advantageous for the input or output impedance of an input or output port to be calibrated.

Various specifications exist depending on the technology used, which may set the optimal input or output impedance value, as well as the tolerances. To respect these specifications, it may be desirable to calibrate the output impedance of the concerned output ports, since it may depend on multiple factors. One can, in particular, mention factors associated with the component manufacturing process, or factors capable of varying along with the circuit operation, and in particular, the temperature of use, or the value of the power supply voltage for an autonomous device. Calibration of the output impedance of a digital port has already been provided by selecting an appropriate number of active transistors in a buffer or driver stage between a control terminal of the output signal and the actual output terminal.

SUMMARY OF THE INVENTION

Calibration circuits known to date, ensuring the selective activation of various transistors, may cause parasitic signals on reconfiguration of the buffer stages during a calibration process. It may thus be desirable to allow calibrations at any time of the operating cycle of a circuit while generating the smallest possible amount of disturbance during calibration cycles.

With this in mind, the embodiments thus provide an integrated circuit that includes at least one digital output port that includes at least one stage assembled in parallel. Each buffer stage is connected, on one hand, to a common output signal control terminal and, on the other hand, to the output terminal of this port. Each buffer stage may include at least two subassemblies of at least two MOSFET transistors. That is, each buffer stage may include a first subassembly of at least two transistors called pull-up transistors, having their sources connected to a common high voltage, and having their drains connected to a common node connected to the output terminal. Each buffer stage may also include a second subassembly of at least two transistors called pull-down transistors, having their sources connected to a common low voltage, and having their drains connected to a common node connected to the output terminal of the port.

In other words, the first subassembly may include at least two pull-up transistors and the second subassembly may include at least two pull-down transistors. All the transistors are mounted in parallel between two common nodes. In particular, the drains of the transistors of the first and second subassemblies are connected to the common node connected to the output terminal of the port. The sources of the pull-up transistors are connected to the common high voltage, and the sources of the pull-down transistors are connected to the common low-voltage.

In addition, the transistors are formed in the thin semiconductor layer of an FDSOI-type substrate. This substrate includes a relatively thick semiconductor layer and an oxide layer separating the thin and thick semiconductor layers. The areas of the thick semiconductor layer facing the transistors are connected to a circuit for adjusting their voltage to vary the threshold voltage of the transistors. In other words, this circuit enables setting, by analog means or circuitry, of the impedance of each of the transistors, by acting on the voltage applied to the back plane or ground plane of the transistor.

Each transistor may be selected via their gate, and the selected transistors are thus mounted in parallel between two common nodes. This approach allows combining a plurality of buffers and a plurality of first and second subassemblies, thus allowing a finer calibration setting.

According to various embodiments the adjustment circuit may be controlled by a comparator stage that includes a voltage divider comprising an external calibration resistor. The adjustment circuit may include a capacitive element having its charge or its discharge controlled by the comparator stage. The adjustment circuit may be controlled by a calibration starting circuit, enabling action of the setting circuit during predetermined periods. Each buffer stage may include a resistive linearization element between the common node to which are connected the sources of the transistors and the output terminal of the output port.

The integrated circuit may also include an activation circuit, capable of selectively connecting the gates of all or part of the transistors of a subassembly to the common output signal control terminal. The integrated circuit may also include a configuration circuit capable of connecting in parallel all or part of the buffer stages.

The present embodiments also provide a method for adjusting the output impedance of a digital output port of an integrated circuit. The port may include one or several buffer stages arranged in parallel, and each connected, on the one hand, to a common terminal for controlling the output signal and, on the other hand, to the output terminal of the port. Each stage may include at least two subassemblies of MOSFET transistors, that is, a subassembly of at least two pull-up transistors having their sources connected to a common high potential, and having their drains connected to a common node connected to the output terminal of the port, and a subassembly of at least two pull-down transistors, having their sources connected to a common low potential, and having their drains connected to a common node, connected to the output terminal.

The transistors may be formed in the thin semiconductor layer of an FDSOI substrate. The substrate may include a thick semiconductor layer and an oxide layer separating said thin and thick semiconductor layers. The voltage of the areas of the thick semiconductor layer may be arranged in front of the transistors and adjusted to set the threshold voltage of each transistor.

According to different alternative executions, all or part of the transistors of each subassembly may be selectively activated by selectively connecting the gate of all or part of the transistors of a subassembly to the common output signal control terminal. All or part of the buffer stages may be selectively connected in parallel.

BRIEF DESCRIPTION OF THE DRAWINGS

FIG. 5 is a schematic diagram of a portion of the circuit for adjusting the back plane voltage applied to the respective pull-up transistor in accordance with an embodiment.

FIG. 6 is another schematic diagram of a portion of the circuit for adjusting the back plane voltage applied to the respective pull-down transistor in accordance with an embodiment.

DETAILED DESCRIPTION OF THE PREFERRED EMBODIMENTS

The following description will use terms power supply voltage or high voltage, also designated by abbreviations $V_{DD}$, $VDD_E$ or the like, to refer to the same type of high voltage level. Similarly, terms "low-level voltage", ground, or abbreviations GND, $GND_E$ or the like are equivalent.

Figure 1:
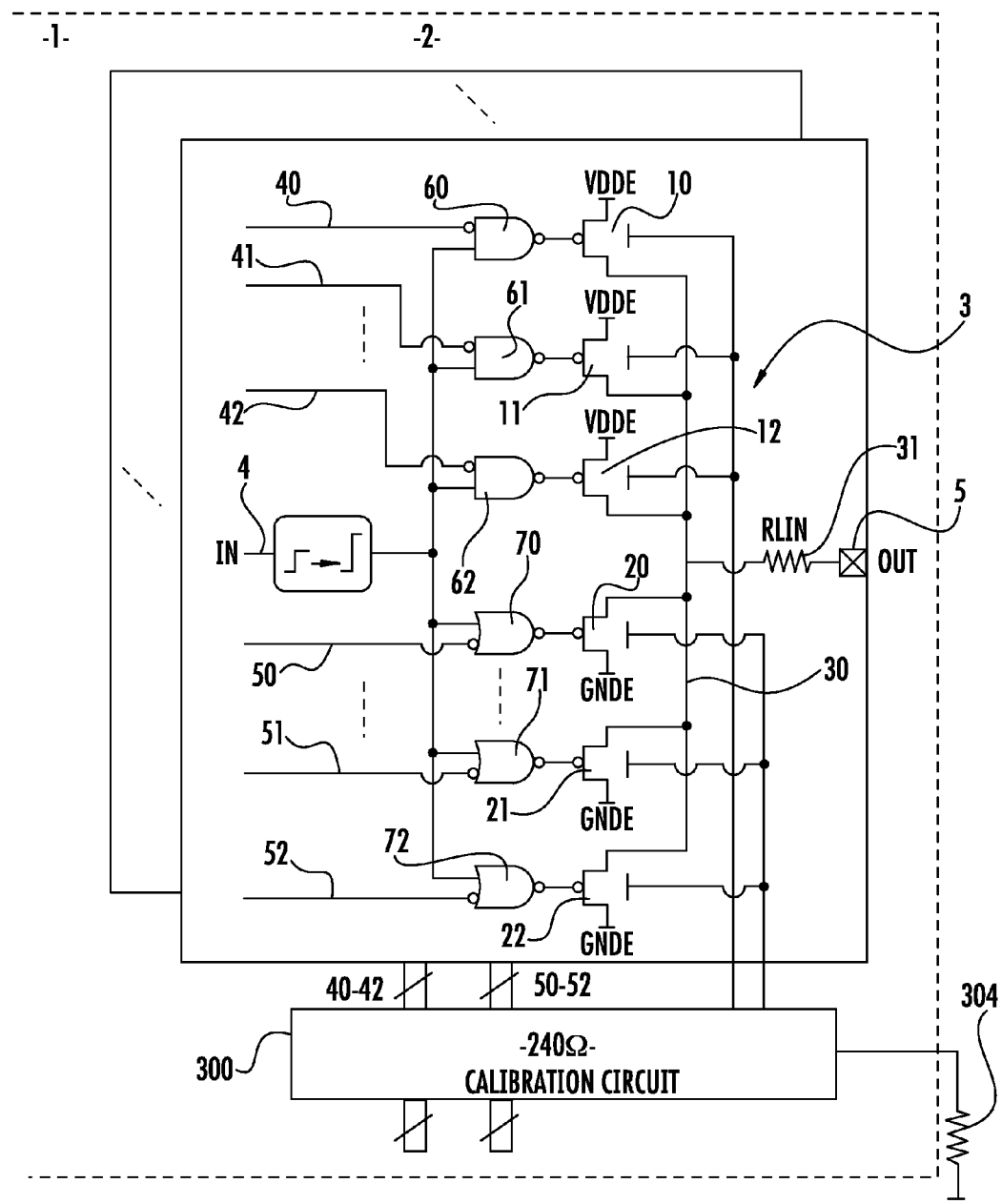
FIG. 1 is a schematic diagram showing an output port according to a first embodiment.

As illustrated in FIG. 1, an integrated circuit 1 includes a plurality of output ports 2. Each output port includes several buffer stages 3 arranged in parallel, and which are all connected to a common terminal 4 for controlling the output signal. The terminal 4 is typically connected to a core portion of the integrated circuit. These different stages 3 are also all connected to output terminal 5 connecting integrated circuit 1 to the neighboring components.

In the illustrated embodiment, each output stage 3 includes a plurality of transistors 10, 11, 12, 20, 21, 22, which enable connection of the output terminal 5 to the high voltage or to the low voltage, according to output signal 4. In practice, the different transistors of a buffer stage have different characteristics enabling coverage of the widest desired impedance range with the appropriate combinations. Thus, as an example, the transistors may have increasing gate widths having their values doubling from one transistor to the other to be able to use a binary selection mode. Of course, other configurations may be envisaged with different distributions of the characteristics of the different transistors.

More specifically, part of these transistors 10, 11, 12, enable connection of the output terminal 5 to a high voltage, typically, a power supply voltage $V_{DDE}$. Such pMOS-type transistors have their drains all connected to a common node 30, itself connected to the output terminal 5 via a linearization resistor 31.

Other transistors 20, 21, 22 may be complementary transistors, that is, nMOS, and have their sources connected to a low potential node $GND_E$, while their drains are all connected to the common node 30, also having the drains of the other pull-up transistors connected thereto.

In the embodiment of FIG. 1, the output port includes a linearization resistor 31, which is used to make the voltage-vs.-current characteristic of the output port more linear. However, in certain configurations, the linearization resistor may be omitted.

The gate of each of these transistors is connected to logic gates enabling to apply the voltage present on control terminal 4 thereto, according to configuration signals. More specifically, pull-up transistors 10, 11, 12 have their gates connected to gates 60, 61, 62 having an inverting output and which provide a logic "and" between the signal originating from control terminal 4 and a configuration signal 40, 41, 42. In other words, when configuration signal 40, 41, 42 is at a high level, transistors 10, 11, 12 are in the off state, whatever the value of the signal originating from the control terminal 4. Thus, transistors 10, 11, 12 are deactivated. Conversely, when configuration signal 40, 41, 42 is at a low level, transistors 10, 11, 12 switch to the on or off state when the signal originating from the control terminal 4 is respectively in the high or low state.

Complementarily, the nMOS-type pull-down transistors have gates controlled by an inverting "or" gate 70, 71, 72 having an input connected to the control terminal 4. The other terminal is connected to a configuration signal 50, 51, 52. Similarly, when the configuration signals 50, 51, 52 are in a low state, transistors 20, 21, 22 are off, whatever the state of the control signal 4. However, when the configuration signals 50, 51, 52 are at a high level, transistors 20, 21, 22 are on or off when the signal from the control terminal 4 is respectively low or high.

In the illustrated embodiment, the different buffer stages 3 are identical, and the control signal for activating their different transistors is also identical so that the different stages are electrically connected in parallel. The general output impedance of the output port thus corresponds to the impedance of a stage divided by the number of stages arranged in parallel. According to an appropriate control of the activation of the different transistors of the stages arranged in parallel, it may be possible to modulate the number of stages arranged in parallel, and thus the value of the general output impedance of the port according to the value required by the application.

Figure 2:
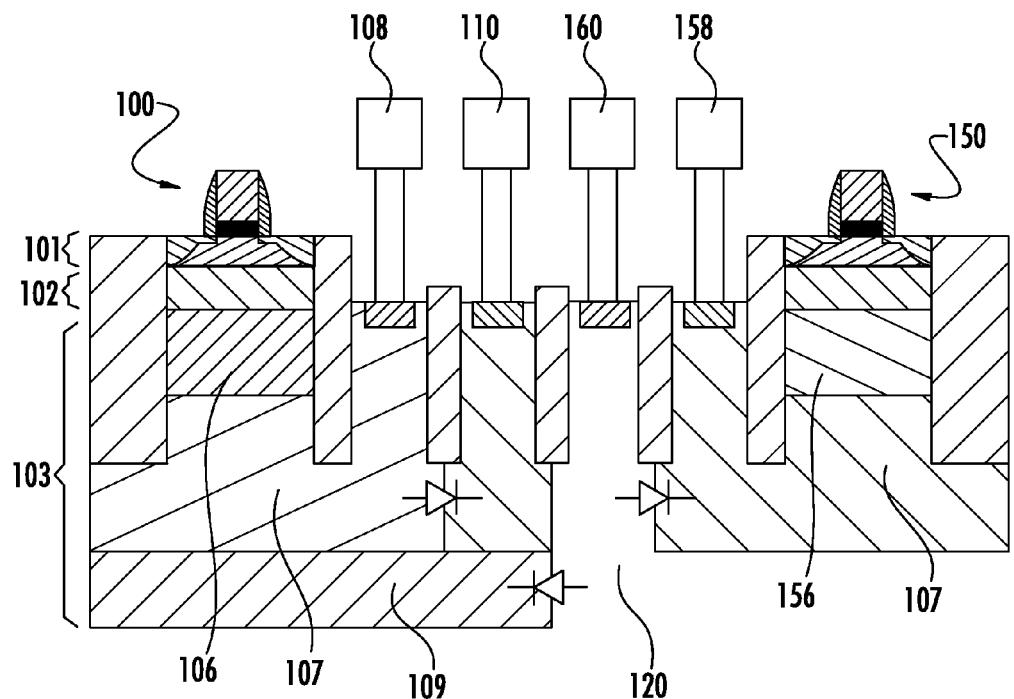
FIG. 2 is a schematic cross-sectional view of an embodiment of a substrate including transistors of the output port of FIG. 1.

Transistors 10, 11, 12, 20, 21, 22 of the output ports are formed from FDSOI-type substrates. Thus, as illustrated in FIG. 2, the pull-down transistor 100 is formed in a thin layer 101 of the FDSOI substrate. The thin semiconductor layer 101 is supported by an oxide layer 102, which separates the thin layer 101 from a thick layer 103. Thus, the transistor 100 may be totally insulated by the oxide layer 102 from the rest of the substrate 103. In contrast to the transistor 100, the thick layer 103 has, in contact with the oxide layer 102, an area forming a ground plane or back plane 106, and having a voltage capable of being controlled through an analog doping well 107 at the level of terminal 108. It should be noted that for an nMOS-type transistor, it may thus be preferable to provide a deep insulation well 109 which is itself set to the high voltage by the terminal 110 to reverse-bias the PN junction formed with the well 107, and thus reduce the chances of the substrate from being at the potential of the terminal 108.

For the pull-up transistors 150 illustrated in FIG. 2, a ground plane area 156 may also be set to a variable voltage to vary the threshold voltage of the transistor 150. For this purpose, an N-doped well 107 enables setting of the ground plane 156 to a variable voltage, higher than the ground, via a terminal 158. It should be noted that it is desirable that the rest of the substrate 120 be maintained at the low voltage via the terminal 160 to reverse-bias the PN junctions between the rest of the substrate and the N well 107 at the variable voltage.

In such a configuration, the ground plane 106 of the pull-down transistor may be taken to a potential ranging up to the voltage of the VDD power supply. This configuration, however, enables the application of a reverse voltage, lower than GND for the pull-down transistor 100, and higher than VDD for the pull-up transistor 150 corresponding to a configuration slowing down the transistor performances.

Figure 3:
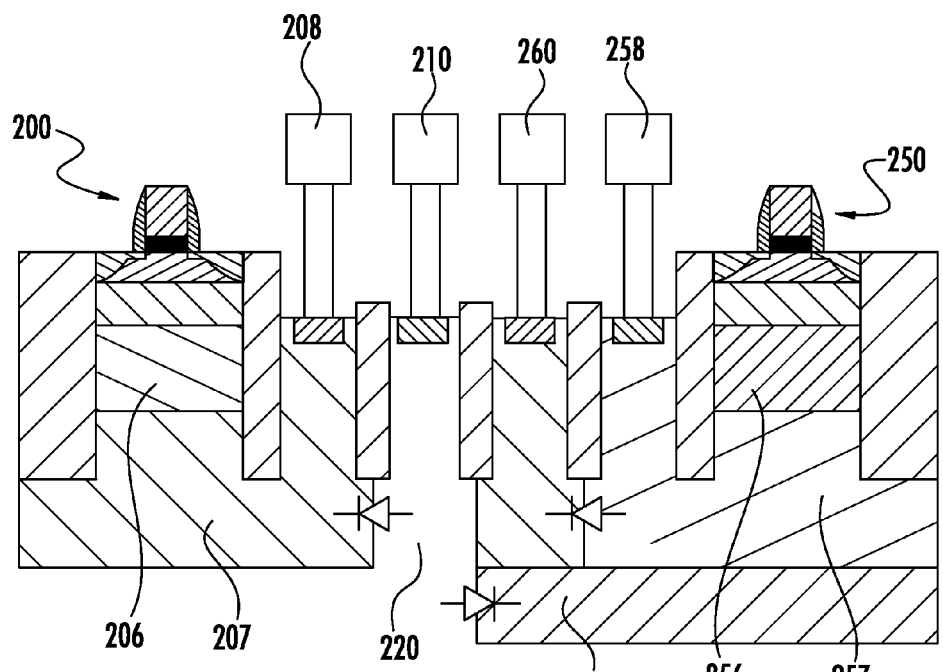
FIG. 3 is a schematic cross-sectional view of another embodiment of a substrate including transistors of the output port of FIG. 1.

FIG. 3 illustrates an alternative configuration where the pull-down transistor 200 has an N-doped ground plane 206, which is placed into contact with the terminal 208 of the application of the variable potential via a well 207, also N-doped. The maintaining of the rest 220 of the substrate at a potential equal to GND enables reverse-biasing of the PN junction between the rest of the substrate 220 and the well 207.

In such a configuration, for the pull-up transistor 250, the area 256 forming the ground plane may be maintained at a variable potential, adjustable via the terminal 258 connected by a P-doped well 257. To insulate the well 257 from the rest of the substrate 220, a deep well 259 is formed and is maintained at a relatively high potential to reverse-bias the PN junction existing with the P well 257, and the junction existing with the rest of the substrate 220.

In such a configuration, the voltage which may be applied to the back plane of the pull-down transistor 200 may be higher than the like in the example of FIG. 2, which enables acceleration of the transistor for obtaining better dynamics. The same can be observed for the pull-up transistor 250 with a ground plane which may be substantially lowered, and in particular, below the zero potential to increase the corresponding effect.

As illustrated in FIG. 1, the terminals enabling setting of the potential of the ground planes of the different pull-up and pull-down transistors are controlled by an adjustment circuit integrated in a circuit for calibrating the impedance of the output port. Similarly, the orders of activation 40, 41, 42, 50, 51, 52 of the different transistors are also controlled by this circuit for calibrating the impedance.

Figure 4:
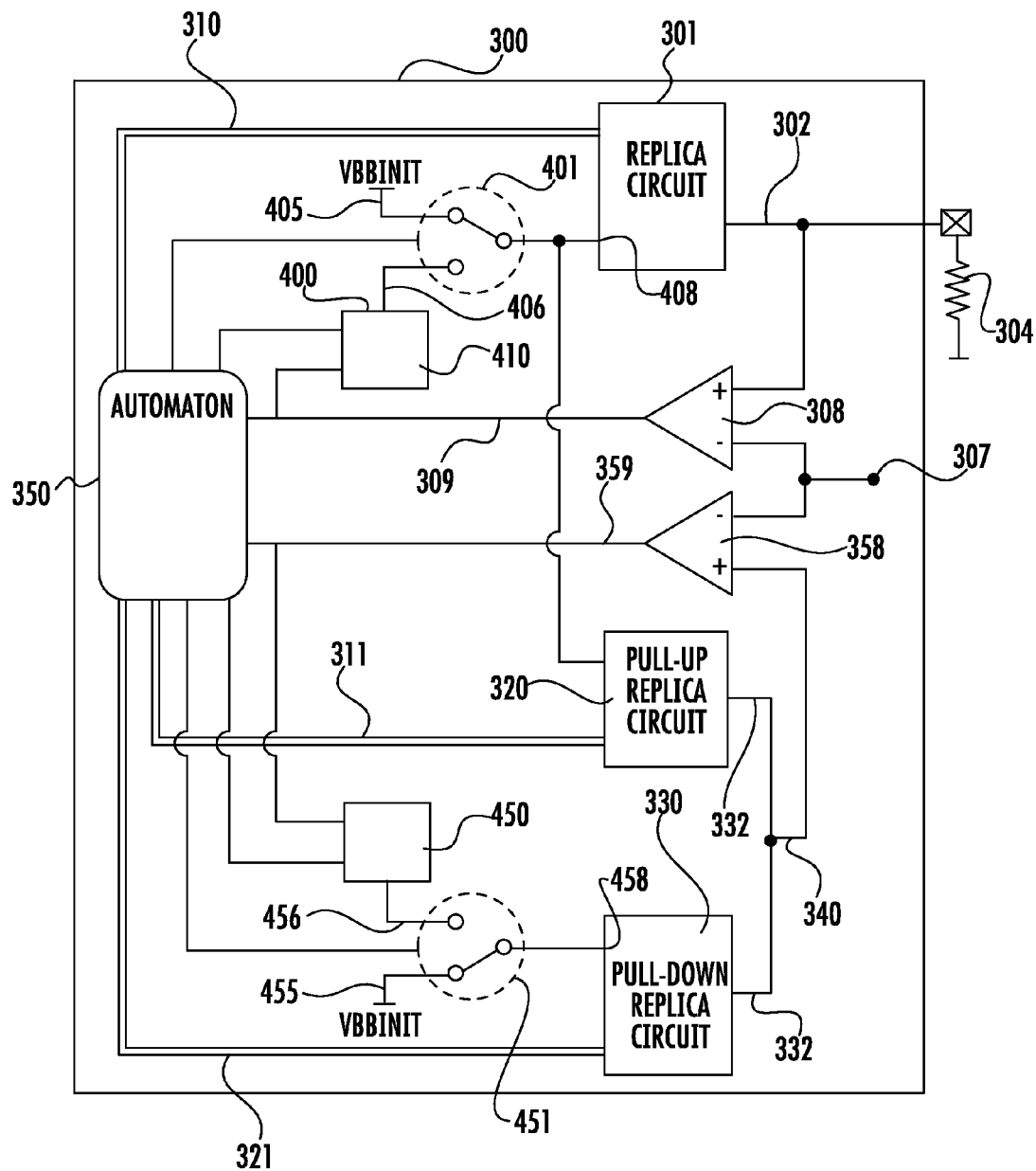
FIG. 4 is a schematic diagram of a circuit for calibrating the output port of FIG. 1.

An embodiment of such a circuit is described in simplified manner in FIG. 4. Specifically, in the illustrated embodiment, the calibration circuit 300 includes a first area 301 corresponding to a replica of the assembly of the pull-up transistors 10-12 and the linearization resistor 31. Thus, the pull-up transistors of circuit 301 are directly controlled by codes 310.

At output 302 of the linearization resistor, the circuit is connected to an external calibration resistor 304 which may have a value determined by the specifications of the technology used. For example, for standard LPDDR 2, it may be desirable for the impedance of the output ports to be 34.3Ω±15%. Still, as an example, when the output port includes seven stages in parallel, it may be desirable that each stage have a nominal individual impedance of 240Ω. By modulating the number of stages placed in parallel, it may thus be possible to program the total impedance to 240Ω, 120Ω, 80Ω, 60Ω, 48Ω, 40Ω, 34.3Ω by selecting the adequate number of stages, individually calibrated to 240Ω.

The external calibration resistor 304 is thus selected with this value so that the output terminal 302 of the circuit 301 replicating of the assembly of pull-up transistors to be half the power supply voltage. For this purpose, an controller 350 scans the different possible combinations of activation codes 310 of the transistors. The output voltage of the replica circuit 301 is sampled to be compared by a comparator 308 to half the high power supply voltage 307. The result of the comparison is sent to the controller 350 to determine the optimal combination of activation codes for obtaining an impedance of the front assembly of pull-up transistors 301, which may be as close as possible to the external calibration resistance 304.

For the pull-down transistors, the calibration is performed by using two replica circuits, that is, on the one hand, a circuit 320 replicating the set of pull-up transistors and, on the other hand, a circuit 330 replicating the set of pull-down transistors.

The transistors of the circuit 320 replicating the pull-up transistors are controlled by activation codes 311 equal to codes 310 determined for the above-mentioned replica circuit 301. The same logic is applied to the set of pull-down transistors of the replica circuit 330, which are controlled by a set of activation codes 321 also controlled by the controller 350.

Midpoint 340 of the outputs 322, 332 of the circuits 320, 330 replicating the pull-down and pull-up transistors is measured and compared with half the power supply voltage by comparator 358. Comparator 358 delivers the results 359 of the comparison to the controller 350 to have it determine the optimal code for the voltage of midpoint 340 to be as close as possible to half the power supply voltage.

This phase of digital calibration, by the selective application of a number of pull-up and pull-down transistors, may be completed by an adjustment of the resistance of each of the transistors by action on the potential applied to the ground plane such as discussed above. More specifically, and as illustrated in FIG. 4, the calibration circuit 300 includes an adjustment stage 400, which enables application of an adjustable voltage on the ground plane and the pull-up transistors.

More specifically, and as illustrated in FIG. 4, the adjustment circuit 400 includes a switch 401 controlled by the controller 350. This switch enables connection of the common terminal 408 of the different ground planes of the transistors of replica circuit 301 either to a fixed value 405, in particular, during initialization phases, and in particular during the adjustment of the different activation codes 40, 42, 50, 52, or to a variable value 406 determined by the adjustment circuit 410, which will be described in further detail below. The adjustable voltage 406 is determined according to the comparison of the output voltage 302 of the replication circuit with half the value of the power supply voltage.

The same line of reasoning applies for the circuit 330 replicating the pull-down transistors with a terminal 458 common to the different ground planes of these transistors and which is selectively connected by the switch 451 controlled by the controller 350, between a fixed voltage 455 for initialization phases, and a variable voltage 456 determined by analog adjustment circuit 450. Similarly, the voltage of the junction point 340 of the circuits 320, 330 replicating the pull-up transistors and the pull-down transistors is measured and compared with half the power supply voltage to enable the adjustment circuit 450 to accordingly modify the adjustable voltage 456.

The circuit 460 for adjusting the variable voltage applied to the ground planes of the pull-up transistors is illustrated in FIG. 5. Thus, at its input, this circuit receives, on the one hand, a signal 501 representative of an order for starting a calibration phase and, on the other hand, result 502 of the comparison of the voltage of the output of the circuit replicating the pull-up transistors with half the power supply voltage. Thus, the signal 501 for controlling the calibration phases can take a zero value outside of the calibration phases, and a value equal to 1 during the calibration phases.

Similarly, the comparison signal has a value equal to 0 or 1 according to whether the output voltage of the replica stage 301 is greater or lower than half the power supply voltage. The first stage 510 of the adjustment circuit 400 delivers two signals 505, 506 to a second stage 520, formed of two multiplexers having a common terminal, and further connected, for one, 521, to the high potential and, for the other, 522, to the low potential.

The first multiplexer 521 generates a signal 524 which controls a transistor 535 enabling raising of the voltage across buffer capacitance 550, itself connected to the different ground planes of the pull-up transistors of replica circuit 301 via the switch 401 illustrated in FIG. 4. The second multiplexer 522 delivers a signal 525 which controls a charge pump 538 which, on the contrary, enables decreasing of the voltage across the capacitance 550 when it is activated.

To return to the first stage, the signal 505 takes a 1 or 0 value according to whether the voltage to be applied to the ground plane is to be increased or decreased to obtain the optimal output resistance. The second signal 506 makes the two multiplexers 521, 522 of the second stage 520 active or blocks them. Thus, when a rising edge is detected on the control signal 501 of a calibration phase, the state of the comparison signal 502 is set to be applied to the common terminals of the two multiplexers 521, 522. The second signal 506 is then set to 0, which starts the calibration process 550 either by increasing or decreasing the voltage across the buffer capacitance, which corresponds to the voltage applied to the different ground planes.

When a state switching is observed on the comparison signal 502, the targeted impedance has been reached. Accordingly, the control signal 506 of the multiplexers switches state by switching to a high value, which stops the analog calibration phase.

The following truth table summarizes the different possible configurations.

| 506 (CAL/CUT) | 505 (UP/DN) | 524 (UP_CMD) | 525 (DN_CMD) | Capacitance voltage 550 (PU_BB) |
|---|---|---|---|---|
| 0 | 0 | 1 | 1 | Decreasing |
| 0 | 1 | 0 | 0 | Increasing |
| 1 | X | 1 | 0 | Stable |

FIG. 6 illustrates a diagram 450 similar to that of FIG. 5, adapted to control the adjustable voltage of the ground planes of the pull-down transistors. The difference may essentially lie in the use of a charge pump 638 to raise the voltage in the capacitance 650 across which the voltage applied to the ground plane can be found.

Figure 7:
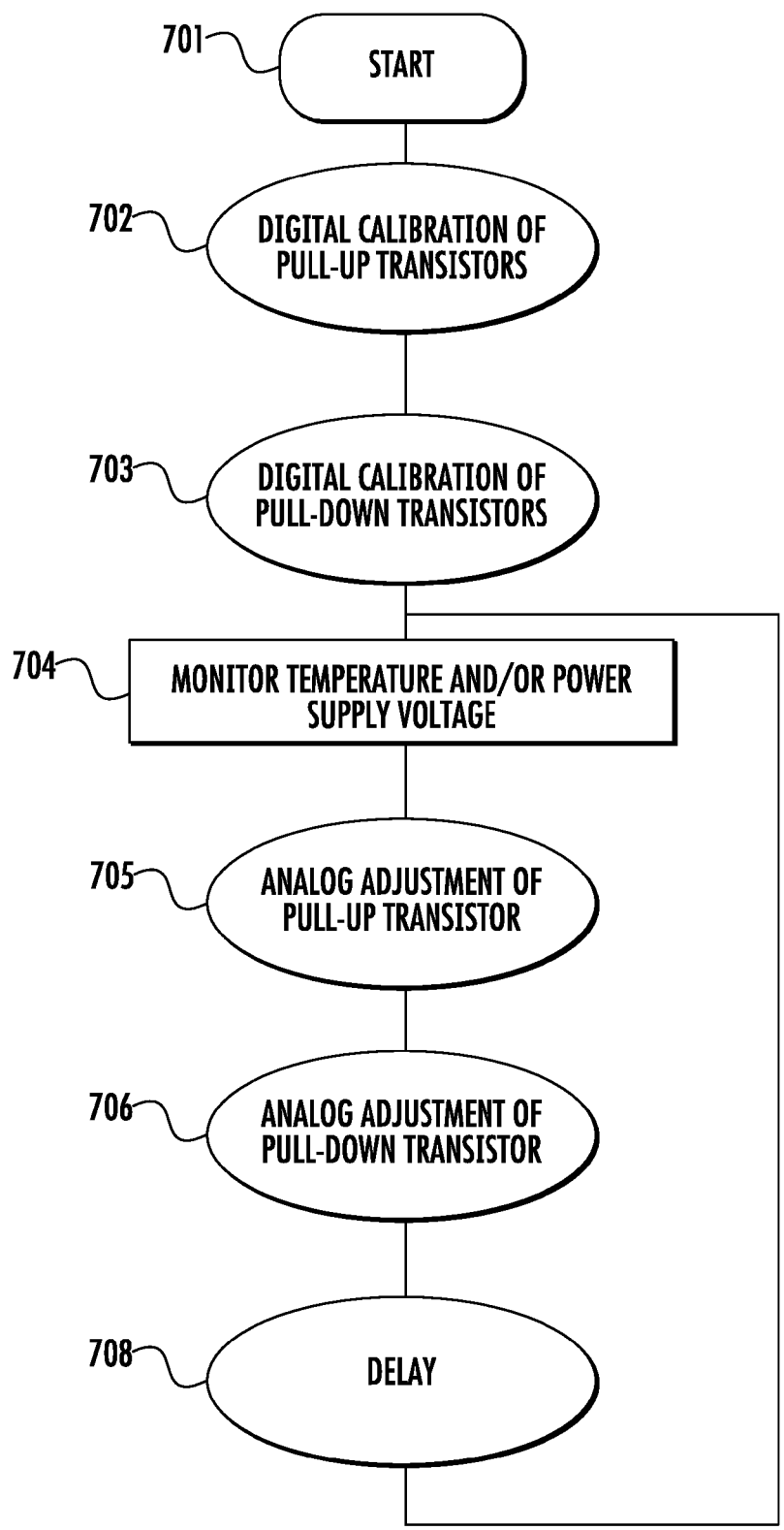
FIG. 7 is flow diagram showing a process for calibrating the output port of FIG. 1.

FIG. 7 illustrates a simplified algorithm of operation of the calibration circuit. Thus, after a phase 701 of starting the integrated circuit, a first phase of digital calibration of the impedance of the assembly of pull-up transistors 702 is first carried out by determining the optimal set of configuration codes to activate the transistors to obtain an impedance as close as possible to the desired impedance.

During first phase 702, the voltage applied to the ground planes of the pull-up transistors is maintained at an initialization value VBBinit. In the specific embodiment corresponding to the configuration of FIG. 3, where the ground plane voltage of the pull-up transistors may be adjusted between −VDDE and +VDDE, VBBinit is equal to GNDE. More generally, VBBinit may be selected as the midpoint between the limiting voltages applicable to the ground plane. This enables, after a digital calibration to compensate for the effects on the impedance due to the manufacturing process, as much amplitude in one direction as in the other to compensate for impedance variations due to phenomena such as temperature or the value of the power supply voltage.

At a subsequent step 703, the digital calibration of the pull-down transistors is performed as mentioned above by maintaining the ground plane voltage of the pull-down transistors at an initial value, for example, selected as the midpoint of the possible excursion. In the case of the configuration of FIG. 3, the voltage applicable to the ground planes of the pull-down transistors may vary between GNDE and 2xVDDE, so that the initial value is selected to be VDDE.

It may be chosen to no longer act on the different activation codes of the transistors of each of the stages to limit jitter phenomena which might occur based upon modifications of the activation codes, in particular of large-weight activation codes. The system thus provides a self-calibration of the impedance only by the analog adjustment 705 of the voltage applied to the ground planes of the pull-up transistors, and then of the pull-down transistors, 706. Both calibrations 705, 706 may be performed regularly, with no impact or at least a limited impact on signal transmission, since the impedance characteristics of the concerned stage vary continuously. Thus, the starting of a new calibration phase by analog means or circuitry 705,706 may be triggered after a settable delay 708, and if desirable, a monitoring 704 of the temperature and/or of the power supply voltage.

Based upon the foregoing, an integrated circuit that includes such a mechanism for adjusting its output impedance may have a better impedance tuning sharpness, since this tuning is performed continuously or no longer discretely. Further, this adjustment may occur more frequently than for a simple digital adjustment, since it generates but little disturbance on signal transmission.

Although a combination of two digital and analog adjustments has been described, the above-described principle may apply to systems where the impedance setting is performed by analog means or circuitry only by adapting the impedance range. Similarly, in certain applications a single pull-up or pull-down transistor per stage may be used, with an accordingly modified impedance excursion.

That which is claimed:

1. An integrated circuit comprising:
   a substrate comprising
      a thin semiconductor layer,
      a thick semiconductor layer, and
      an oxide layer between said thin and thick semiconductor layers;
   at least one digital output port comprising
      an output terminal,
      a common node coupled to said output terminal, and
      a plurality of buffer stages coupled in parallel, and each coupled to a common terminal to control an output signal and said output terminal, each of said plurality of buffer stages comprising
         a plurality of subassemblies comprising a plurality of MOSFET transistors, at least one subassembly comprising a plurality of pull-up transistors having sources coupled to a common high voltage, and having drains coupled to said common node, and at least one other subassembly comprising a plurality of pull-down transistors having sources coupled to a common low voltage, and having drains coupled to said common node, said plurality of pull-up and pull-down transistors being formed in said thin semiconductor layer, each of said plurality of pull-up transistors and plurality of pull-down transistors having a threshold voltage; and
   an adjustment circuit coupled to said plurality of pull-up and pull-down transistors adjacent areas of said thick semiconductor layer facing said plurality of pull-up and pull-down transistors, said adjustment circuit configured to vary the threshold voltage of each of said plurality of pull-up and pull-down transistors.

2. The integrated circuit of claim 1, further comprising a comparator stage configured to control said adjustment circuit, and comprising a voltage divider comprising an external calibration resistor.

3. The integrated circuit of claim 2, wherein said adjustment circuit comprises a capacitive element configured to be one of charged or discharged based upon said comparator stage.

4. The integrated circuit of claim 1, further comprising a calibration starting circuit configured to control said adjustment circuit by at least activating said adjustment circuit during predetermined periods.

5. The integrated circuit of claim 1, further comprising a resistive linearization element coupled between said common node and the output terminal.

6. The integrated circuit of claim 1, further comprising an activation circuit configured to selectively couple gates of at least a portion of said plurality of pull-up and pull-down transistors to the common terminal.

7. The integrated circuit of claim 1, further comprising a configuration circuit configured to connect, in parallel, at least a portion of said plurality of buffer stages.

8. An integrated circuit comprising:
   a substrate comprising
      a thin semiconductor layer,
      a thick semiconductor layer, and
      an oxide layer between said thin and thick semiconductor layers;
   at least one digital output port comprising
      an output terminal,
      a common node coupled to said output terminal, and
      at least one buffer stage coupled to a common terminal and said output terminal, said at least one buffer stage comprising
         a plurality of pull-up transistors having sources coupled to a common high voltage, and having drains coupled to said common node, and
         a plurality of pull-down transistors having sources coupled to a common low voltage, and having drains coupled to said common node,
         said plurality of pull-up and pull-down transistors being formed in said thin semiconductor layer, each of said plurality of pull-up transistors and plurality of pull-down transistors having a threshold voltage; and
      an adjustment circuit coupled to said plurality of pull-up and pull-down transistors adjacent areas of said thick semiconductor layer facing said plurality of pull-up and pull-down transistors, said adjustment circuit configured to vary the threshold voltage of each of said plurality of pull-up and pull-down transistors.

9. The integrated circuit of claim 8, wherein said at least one at least one buffer stage comprises a plurality of buffer stages coupled in parallel.

10. The integrated circuit of claim 8, further comprising a comparator coupled to said adjustment circuit and an external calibration resistor; and wherein said comparator is configured to control said adjustment circuit.

11. The integrated circuit of claim 10, wherein said adjustment circuit comprises a capacitive element configured to be one of charged or discharged based upon said comparator.

12. The integrated circuit of claim 8, further comprising a calibration starting circuit configured to activate said adjustment circuit during predetermined periods.

13. The integrated circuit of claim 8, further comprising a resistive linearization element coupled between said common node and the output terminal.

14. The integrated circuit of claim 8, further comprising an activation circuit configured to selectively couple gates of at least a portion of said plurality of pull-up and pull-down transistors to the common terminal.

15. The integrated circuit of claim 8, further comprising a configuration circuit configured to connect, in parallel, at least a portion of said plurality of buffer stages.

16. A method for adjusting output impedance of a digital output port of an integrated circuit (IC), the port comprising at least one buffer stage coupled to a common terminal and an output terminal, the at least one buffer stage comprising a plurality of pull-up transistors having sources coupled to a common high voltage, and having drains coupled to said common node, and a plurality of pull-down transistors having sources coupled to a common low voltage, and having drains coupled to said common node, the plurality of pull-up and pull-down transistors being formed in a thin semiconductor layer of a substrate, each of the plurality of pull-up transistors and plurality of pull-down transistors having a threshold voltage, the method comprising:
   using an adjustment circuit coupled to the plurality of pull-up and pull-down transistors adjacent areas of a thick semiconductor layer of the substrate facing the plurality of pull-up and pull-down transistors to vary the threshold voltage of each of the plurality of pull-up and pull-down transistors.

17. The method of claim 16, wherein the at least one buffer stage comprises a plurality of buffer stages coupled in parallel.

18. The method of claim 16, further comprising selectively coupling gates of at least a portion of the plurality of pull-up and pull-down transistors to the common terminal.

* * * * *

UNITED STATES PATENT AND TRADEMARK OFFICE
CERTIFICATE OF CORRECTION

PATENT NO.         : 8,975,938 B2                                      Page 1 of 1
APPLICATION NO.    : 13/904606
DATED              : March 10, 2015
INVENTOR(S)        : Soussan et al.

It is certified that error appears in the above-identified patent and that said Letters Patent is hereby corrected as shown below:

In the Claims

Column 10, Lines 3-4        Delete: "at least one at least one"
                            Insert: --at least one--

Signed and Sealed this
Eighteenth Day of August, 2015

Michelle K. Lee
*Director of the United States Patent and Trademark Office*